United States Patent [19]

Eichelberger et al.

[11] 4,051,352

[45] Sept. 27, 1977

[54] LEVEL SENSITIVE EMBEDDED ARRAY LOGIC SYSTEM

[75] Inventors: Edward Baxter Eichelberger, Purdy Station, N.Y.; Eugene Igor Muehldorf, Potomac, Md.; Ronald Gene Walther, Vestal, N.Y.; Thomas Walter Williams, Longmont, Colo.

[73] Assignee: International Business Machines Corporation, Armonk, N.Y.

[21] Appl. No.: 701,052

[22] Filed: June 30, 1976

[51] Int. Cl.$^2$ .................. G06F 7/38; H03K 19/00
[52] U.S. Cl. ........................... 364/716; 307/203
[58] Field of Search ................ 235/152, 156; 340/172.5; 307/203

[56] References Cited

U.S. PATENT DOCUMENTS

| | | | |
|---|---|---|---|
| 3,787,817 | 1/1974 | Goldberg | 340/172.5 |
| 3,983,538 | 9/1976 | Jones | 340/172.5 |

OTHER PUBLICATIONS

J. E. Elliott et al., "Array Logic Processing" *IBM Technical Disclosure Bulletin*, vol. 16, No. 2, July 1973, pp. 586–587.

*Primary Examiner*—David H. Malzahn
*Attorney, Agent, or Firm*—Wesley Debruin

[57] ABSTRACT

A generalized and modular logic system is described for all arithmetic/logical units and their associated control storage and any other arrays. The logic system is partitioned into sections formed of combinational logic networks, storage circuitry, and arrays. The storage circuitry is sequential in operation and employs clocked dc latches. Two or more synchronous, non-overlapping, independent system clock trains are used to control the latches. The array is a rectangular array of storage element, M × N where, M is the number of words in the array and N is the number of bits in each word. The array may be read only, or it may be a read/write array. The array may be a programmable logic array (PLA). A single-sided delay dependency is imparted to the system. The feedback connections from the respective latch circuitry are made through combinational logic or an array to other latch circuitry. The clocking of the latches and of the array, if any, are such that the network may be operated in a race free mode. With each latch, there is provided additional circuitry so that each latch acts as one position of a shift register having input/output and shift controls that are independent of the system clocks and the system input/outputs. All of the shift register latches are coupled together into a single shift register. The logic between the latch inputs and the array inputs has the property that a 1 to 1 correspondences can exist between array inputs and the latch inputs. Furthermore, all of the array outputs are uniquely detectable at the latch or primary outputs.

16 Claims, 13 Drawing Figures

LEVEL SENSITIVE EMBEDDED ARRAY LOGIC SYSTEM

FIELD OF THE INVENTION

This invention relates to logic systems which include arrays for use in digital computers and the like and, more particularly, to an organization of logic in such systems to render them modular, generalized and level-sensitive. Further, this invention relates to logic systems which include arrays and more particularly to the organization thereof whereby the testing and generation of test data are facilitated.

Cross-Reference to Related Applications and Patents

U.S. patent application Ser. No. 701,041, entitled "Method of Propagation Delay Testing a Functional Logic System with Embedded Array" filed June 30, 1976 by Messrs. E. B. Eichelberger, E. I. Muehldorf, R. G. Walther and T. W. Williams, and of common assignee.

U.S. patent application Ser. No. 701,054, entitled "Method of Level Sensitive Testing A Functional Logic System with Embedded Arrray", filed June 30, 1976 by Messrs. E. B. Eichelberger, E. I. Muehldorf, R. G. Walther and T. W. Williams, and of common assignee.

U.S. patent application Ser. No. 701,053 entitled "Reduced Overhead for Gated B Clock Testing" filed June 30, 1976 by Messrs. E. B. Eichelberger and T. W. Williams and of common assignee.

U.S. patent application Ser. No. 589,231, entitled, "High Density Semiconductor Chip Organization" by E. B. Eichelberger and G. J. Robbins, filed June 23, 1975, granted as U.S. Pat. No. 4,006,492 on Feb. 1, 1977, and of common assignee.

U.S. patent application Ser. No. 701,055 entitled "Accordion Register" by Hou-Fung Lee, filed June 30, 1976 and of common assignee.

U. S. patent application Ser. No. 701,376, entitled "Clock Generation Network" by E. B. Eichelberger and S. DasGupta, filed June 30, 1976 and of common assignee.

U.S. patent appliction Ser. No. 534,606, filed Dec. 20, 1974 entitled "Testing Embedded Array" by E. B. Eichelberger, granted as U.S. Pat. No. 3,961,252 on June 4, 1976 and of common assignee.

U.S. patent application Ser. No. 534,608, entitled "Testing Embedded Arrays" by J. R. Cavalieri and R. Robortaccio, filed Dec. 20, 1974, granted as U.S. Pat. No. 3,961,254 on June 1, 1976 and of common assignee.

U.S. patent application Ser. No. 534, 605, entitled "Testing Embedded Arrays" filed Dec. 20, 1974 by W. P. Hurley and H. P. Muhlfeld, granted as U.S. Pat. No. 3,961,251 on June 1, 1976 and of common assignee.

U.S. Pat. No. 3,783,254, entitled "Level Sensitive Logic System", application Ser. No. 297,543, filed Oct. 16, 1972 granted January 1, 1974 to Edward B. Eichelberger and of common assignee.

United States Pat. No. 3,761,695, entitled "Method of Level Sensitive Testing a Functional Logic System", application Ser. No. 298,087, filed Oct. 16, 1972, granted September 25, 1973 to Edward B. Eichelberger and of common assignee.

U.S. Pat. No. 3,784,907, entitled "Method of Propagation Delay Testing a Functional Logic System", application Ser. No. 298,071, filed Oct. 16, 1972, granted Jan. 8, 1974 to Edward B. Eichelberger and of common assignee.

BACKGROUND AND DESCRIPTION OF THE PRIOR ART

In the past, the designer of computer logic with embedded arrays has had complete flexibility in arranging logic circuitry to implement systems and subsystem logic functions in central processing units, channels and control units employed in digital computing apparatus. A significant variety of design implementations has resulted from the exercise of this flexibility. Each of these implementations has its own special dependency on the ac characteristics of the individual circuits employed in the system.

The independence and flexibility characterizing the arrangements of the designer often led to unexpected system timing problems, complicated and complex problems in testing the logic around arrays themself, and a significant complexity and detail required for educating the field service personnel for such computing systems. However, it had the advantage of permitting the designer to use all techniques to obtain the best performance by employing the fewest number of circuits. The interface between the logic designer and the component manufacturer was reasonably well defined and the approach of the past could be supported in component manufacturing since the ac parameters such as rise time, fall time, individual circuit delay, access time, etc., could rather readily be tested. The arrays were tested as arrays on cards which had only arrays and the logic cards, which did not have arrays, were tested as logic cards on logic testers.

With the advent of large scale integration, however, this well defined and reliably tested interface no longer exists. It has become impossible or impractical to test each circuit for all of the well known ac circuit parameters and to test each array for all of its well known ac circuit parameters.

As a result, it is necessary to partition and divide logic systems and subsystems into functional units having characteristics that are substantially insensitive to these parameters. Large scale integration provides the ability for the logic designer as well as the component manufacturer to utilize the capacity for placing hundreds of circuits or a complete array on a single chip of semiconductive material. Such an ability offers the potential for reducing power, increasing speed, and significantly reducing the cost of digital networks.

Unfortunately, a number of serious considerations are involved before this potential can be achieved. For example, in a medium sized computing system having approximately 40,000 individual circuits plus arrays, it has not been uncommon to effect 1500 or more engineering changes during the development period for product. It is readily apparent that the implementation of such a significant number of engineering changes approaches the impossible when dealing with the lowest level modular unit of a computer which has hundreds of circuits contained within it.

Another area which must be considered as technology moves into the fabrication of large scale integrated functional units is the product testing required prior to its incorporation into a computing system. The subsequent diagnostic tests performed during field servicing as well as the simulation that is performed during design and manufacturing are factors for consideration in fabricating such functional units.

In the past, each individual array has been tested for the usual and normal ac and dc parameters. Access to the modular unit for applying the input test condition and measuring the output responses has been achieved through a fixed number of input/output connection pins. Furthermore, the arrays and logic were not mixed. However, in the realm of large scale integrated functional units, the same number of input/output pins are available, but there is considerably more circuitry mixed with arrays.

Thus, in a typical module containing 100 chips with logic chips having up to 600 (averaging 400) circuits and 25 array chips, the module would contain at least 40,000 circuits and 25 arrays. Parametric testing of such a unit is not possible. DC testing and AC testing all of the logic which does not feed arrays or is not fed from arrays can be performed by the structure methods and techniques described in the afore-identified U.S. Pat. Nos. 3,761,695, 3,783,254 and 3,784,907 granted to Edward B. Eichelberger and assigned to the same assignee. If functional tests of the arrays are attempted on such a unit, having the prior art logical design configurations, the extent of test coverage of logic immediately around the array and for the array would be significantly low and the level of reliability for use in a computing system would also be significantly low. Accordingly, provision must be made for eliminating the dependencies of the past. Current logic/array systems must be avoided and new logic/array organizations must be utilized in computing systems if the advantages of large scale integration are to be optimized. Testing of these logic/array systems must be performed in a functional manner on these new logical units, be it at the chip level, the module level, or other level. This testing is accomplished by automatically generating tests that assume the proper operation of every logic element in the unit.

SUMMARY OF THE INVENTION

As contrasted with the prior art organization and system of logic/array, the logic/array system of this invention are generalized and applicable to all levels of hierarchy of modular units. The generalized logic/array systems have a single-sided delay dependency, avoid all race conditions and hazards and eliminate the normal and usual ac timing dependencies. The functional logical units are made solely dependent on the occurrence of the signals from plural system clock trains, which control the latches and arrays. This is accomplished by using clocked dc latches for all internal storage circuitry and arrays in the arithmetic/logic units of the computing system. This latch circuitry is functionally partitioned along with associated combinational logic networks and arrays and arranged in sets. The plural clock trains are synchronous but non-overlapping and independent. The sets of latch circuitry are coupled through combinational logic and/or arrays to other sets of latches that are controlled by other system clock trains or combinations of clock trains. One of the ways to accomplish this objective is to use one system clock to set latches feeding the array and a different system clock to set the latches fed by the array.

The logic system of this invention incorporates another concept, aside from the single-sided delay dependency giving hazard-free and race-free operation. It provides for each latch circuit which is fed by an array or which feeds an array, to include additional circuitry so that each latch functions as a shift register latch having input/output and shift controls that are independent of the system clocks and the system input/outputs. All of these shift register latches are coupled together to form one or more shift registers. Each has a single input, a single output and shift controls. These shift register latches may be generally of the type disclosed in the afore-identified Eichelberger U.S. pat. Nos. patents (3,761,695, 3,783,254, and 3,784,907).

With this additional circuitry, all of the system clocks can be de-activated, isolating all of the latch cicuits from one another, and permitting a scan-in/scan-out function to be performed. The effect is to reduce all of the sequential circuitry containing arrays to arrays which are fed by and feed combinational logic networks. This permits automatic test generation to be performed for each circuit and array in the entire system.

It has been found necessary to reduce sequential logic networks effectively to combinational logic as the problem of automatic test pattern generation is more easily solved for the latter type of network. Furthermore, it has been found that arrays must be isolated in order to generate and apply patterns to them. In this invention the isolation is accomplished by additional circuitry such that there is a one-to-one correspondence between array inputs and latches which feed the array, and all array outputs are uniquely detectable by observing at latches or outputs of the network. The concept of the invention provides for the latches to be converted into shift register latches. When this is accomplished, the shift register latches are then employed to shift in any desired test pattern of binary ones and zeros where they are retained for use as inputs to the combinational logic network, stored in the array, read out of the array, clocked into the latches and then shifted out for measurement and comparison to determine the functional response of the logical unit. If the one-to-one condition is sensitized, the array or the logic fed by the array is being tested and if the one-to-one condition is not sensitized then the combinational logic which feeds the array or the combinational logic which is fed by the array is being tested.

The use of these latches enables dc testing of the logic system to be performed. By controlling and measuring the maximum circuit delay through the combinational logic, or array an appreciation of the ac response for the unit is obtained. With such a system, the state of every latch in the logic system may be monitored on a single cycle basis by shifting out all the data in the latches to some sort of a display device. This may be accomplished without disturbing the state of the sub-system, if the data is also shifted back into the latches in the same order as it is shifted out.

The arrangement has the effect of eliminating the need for special test points in such a system and therefore, enables a greater density of circuit packaging to be achieved. Another advantage for such a system is that it provides a simple standardized interface allowing greater flexibility in creating operator or maintenance consoles. The consoles are readily changeable without in any way changing the logic system. Diagnostic tests may be performed under the control of another processor or tester, and in addition, perform such functions as reset, initialization and error recording. One of the most significant advantages of this logic organization and system is that it enables marginal testing to be implemented by merely controlling the speed at which the system clocks and array controls operate. From this test data, it can be readily determined as to the speed of responses of the functional unit.

One of the significant features of the invention is the implementation of shift register latches as basic building blocks in a logic organization with arrays. Plural clock trains control groups of the shift register latches and array control pulses in operation of the system. Independent accessing and controls are also provided for these latches for the independent scan-in/scan-out function to be performed.

It is a primary object of the invention to provide a Level Sensitive Embedded Array Logic System.

It is an object of the invention to provide a Level Sensitive Embedded Array Logic System which may be readily and effectively tested.

It is an object of the invention to provide an improved organization and arrangement of interconnected combinational logic circuit means and embedded array storage means, all fabricated on a single semiconductor chip.

It is an object of the invention to provide improved organization and arrangement of interconnected combinational logic network means, embedded array storage means and shift register means all contained in an electronic package, where said organization and arrangement facilitates the dynamic measurement of the merit of said combinational logic network means, embedded array storage means, and shift register means, respectively, buried within said electronic package.

It is an object of the invention to provide circuitry including combinational logic circuit means and embedded array storage means all arranged and interconnected to facilitate testing irrespective of the level of the package, such as chip, module, card, board and system level.

The foregoing and other objects, features and advantages of the invention will be apparent from the following more particular description of a preferred embodiment of the invention, as illustrated in the accompanying drawings.

DESCRIPTION OF THE DRAWINGS

FIG. 3 may be considered to be a somewhat more detailed showing of the array depicted in the Level Sensitive Embedded Array Logic System of FIG. 1.

DESCRIPTION OF THE PREFERRED EMBODIMENT

Figure 1:
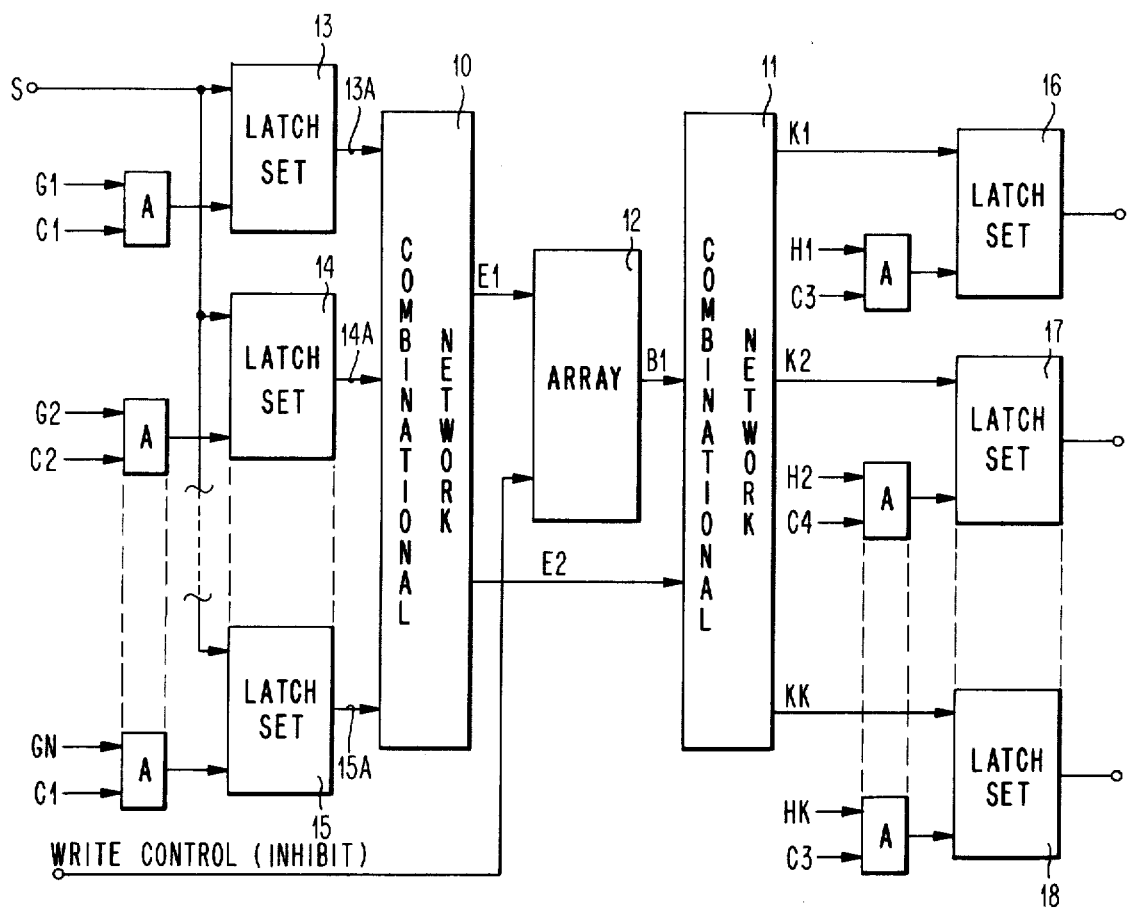
FIG. 1 is a schematic diagram of the organization and general arrangement of a Level Sensitive Embedded Array Logic System in accordance with the invention.

The generalized and modular logic system of the invention has a common organization and structure. It is applicable to any binary digital machine which uses arrays. A system or subsystem in accordance with the invention would form a substantial functional part of a central processing unit, a channel or a control unit in the computing system. Such an organization and structure assists in large scale integrated chip and module testing, field diagnostics and technology upgrading. Almost all functions implementable by an arrangement of logic circuits and arrays can be implemented using this organization and structure. As will be apparent from the description which follows hereinafter, non-digital functions such as analog circuits may not be organized according to the principles of the invention.

The logic configuration with an array of the invention is characterized by having a single-sided delay dependency. The logic organization employs the concept of configuring so that correct operation of the structure is not dependent on rise time, fall time or minimum delay of any individual circuit or array in the system. The only dependency is that the total delays through a number of levels or stages of logic to, or from, an array is less than some known value. Such a configuration is referred to as level sensitive.

For purposes of definition, a logic system containing arrays is level sensitive if, and only if, the steady state response to any allowed input stage change is independent of the circuit and wire delays within the system. Also if an input state change involves the changing of more than one input signal, then the response must be independent of the order in which they change.

It is readily apparent from this definition that the concept of level sensitive operation is dependent on having only allowable input changes. Thus, a level sensitive configuration includes some restriction on how the input changes occur. As will be described more fully hereinafter, these restrictions on input changes are applied almost exclusively to system clocking signals and array control inputs. Other input signals such as data signals have virtually no restrictions on when they may occur.

The term "steady state response" refers to the final value of all internal storage elements such as flip flops as feedback loops. A level sensitive system is assumed to operate as a result of a sequence of allowed input state changes with sufficient time lapse between changes to allow the system to stabilize in the new internal state. This time duration is normally assured by means of the system clock signal trains that control the dynamic operation of the logic configuration and the array control inputs which control the operation of the array.

The logic organization of the invention also incorporates the concept of configuring all internal storage elements, which feed arrays or are fed by arrays so that they may function as a shift register or portions of shift registers. To implement this concept, all storage within the logic organization is accomplished by utilizing latches that are free of hazards or race conditions, thereby obtaining logic systems that are insensitive to ac characteristics such as rise time, fall time and minimum circuit delay.

The latches are level sensitive. The system is driven by two or more non-overlapping clock signal trains that are independent of each other. Each of the signals in a train need have a duration sufficient only to set a latch. The excitation signal and the gating signal for any clocked latch are a combinational logic function of the system input signals and the output signals from latches that are controlled by other clock signal trains then the train providing an input to the first mentioned clocked latches, and array output.

One way to accomplish this latter objective, to be described more fully hereinafter, is to have each such clocked latch controlled by exactly one of the system clock signals. When the gating signal and clock signal are both in an "on" or "up" condition, the clocked latch is set to state determined by the excitation signal for that latch.

A generalized logic organization and structure incorporating these concepts is shown in FIG. 1. The configuration is formed by two combinational logic networks 10, 11 arranged before and after the array 12. Network 10 is coupled into the array 12 and network 11. Network 10 also accepts the latch set output signals 13A, 14A, and 15A from latch sets 13, 14 and 15. Network 11 accepts signals (E2) from latch sets 13, 14 and 15, possibly via network 10, and it accepts signals (B1) from the array. Network 11 is coupled into a set of latches 16, 17 and 18 respectively. Effectively then, the logic system with an embedded array is partitioned into a plurality of arrays embedded into a combinational network. Although one such embedding is shown, it is to be understood that any number more than the number shown may be arranged in parallel in accordance with the invention.

Each of the combinational networks 10, and 11 is a multiple input, multiple output, logic network. It includes any number of levels or stages of combinational circuits which may take the form of conventional semiconductor logic circuits. Although the networks in most instances in such a system are complex and include a number of stages of logic, it is to be understood as will be described more fully hereinafter, that the network may be simplex or trivial and consist only of conductors from one set of latches to another.

Figure 3:
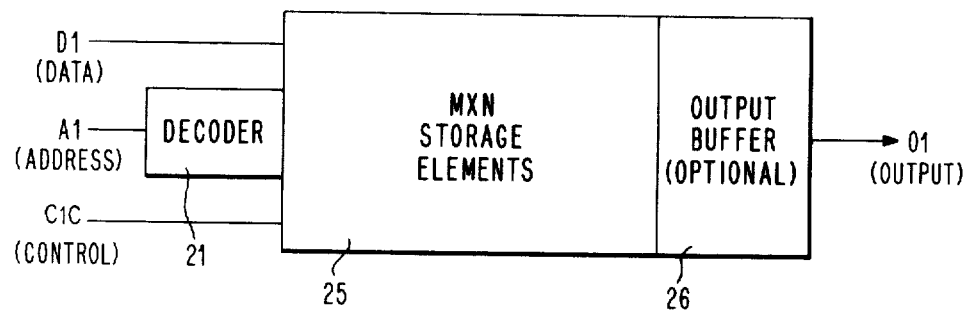
FIG. 3 is a schematic block diagram representing an M × N array that may be employed in practicing the invention.

Each network is responsive to any unique input combination of signals to provide a unique output combination of signals. The output signals E1, E2, K1, K2, Kk, B1 are actually sets of output signals so that the symbol E1 stands for $e11, e12, -, e1N$. Similarly, the symbols G1, G2, Gn, H1, H2, and HK refer to sets of gating signals that may be provided by each of the combinational networks of the rest of the system. The input signals provided to the latch sets 13, 14, 15 are the external input signals indicated as a set S of such signals. The input signals S may be from the remaining portion of the system which may be in accord with the preferred embodiment of the invention disclosed in U.S. Pat. No. 3,783,254. Similarly the outputs from latch set 16, 17, 18 are coupled to the rest of the system even into latch set 13, 14, 15. It is to be understood throughout the description of this invention that the term "set" shall mean a single item (signal) or a substantial plurality of such items (signals). The array in FIG. 1 has three sets of inputs D1, A1 and C1C as shown in FIG. 3. The input signal D1 represents the data to be stored in the array at address A1 when the control inputs C1C are in the write mode. When the control inputs C1C are in the read mode then the data previously stored at address A1 will be present on the output O1. If a read only array is used then D1 inputs are superfluous. There may be data output buffering which will hold the results of a read operation until the next read operation.

The M × N array depicted in FIG. 3 may be, for example, generally of the type disclosed and claimed in U.S. patent application Ser. No. 480,794, entitled "Improved Read/Write Array", filed June 19, 1974 by R. I. Spadavecchia and J. R. Struk, and of common assignee herewith.

Figure 9:
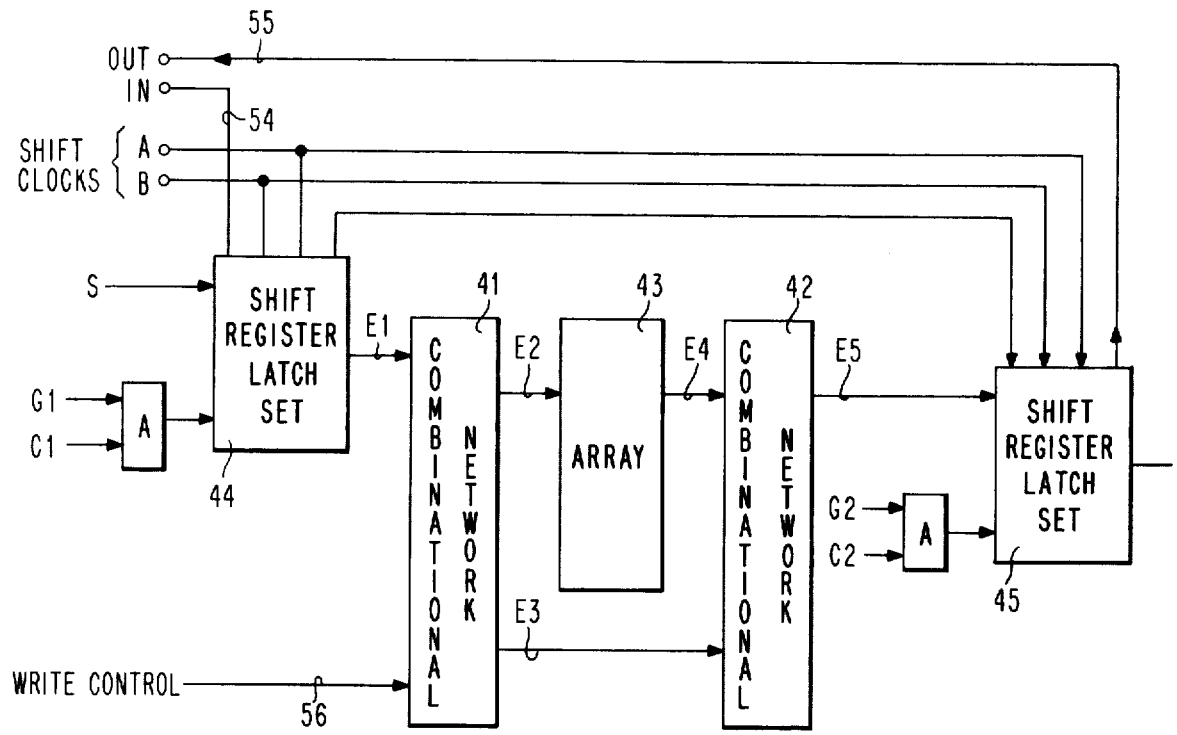
FIG. 9 is a schematic diagram of the organization and general arrangement of a Level Sensitive Embedded Array Logic System, in accordance with the invention, having provision for accomplishing Scan In/Scan Out of the system.

It is to be appreciated that the array as broadly depicted by reference character 12 in FIG. 1 and reference character 43 in FIG. 9, may be a $m \times n$ memory array or a programmable logic array, each of which may be generally of a type well-known to the art. Reference is made to U.S. Pat. No. 3,593,317, entitled "Partitioning Logic Operations in a Generalized Matrix System", granted July 13, 1971 to H. Fleisher, A. Weinberger, and Vaughn D. Winkler on application Ser. No. 889,024 filed Dec. 30, 1969 and of common assignee herewith; U.S. Pat. No. 3,863,232, entitled "Associative Array", granted Jan. 28, 1975 to D. D. Johnson, C. L. Kaufman, F. H. Lohrey and G. J. Robbins on application Ser. No. 428,300, filed Dec. 26, 1973, and of common assignee herewith; U.S. Pat. No. 3,936,812, entitled "Segmented Parallel Rail Paths for Input/Output Signals" granted Feb. 3, 1976 to D. T. Cox, W. T. Devine and G. J. Kelly on application Ser. No. 537,218 filed Dec. 30, 1974 and of common assignee herewith; the article entitled "Hardware Implementation of a Small System in Programmable Logic Arrays", by J. C. Logue, N. F. Brickman, F. Howley, J. W. Jones and W. W. Wu published in the March 1975 issue of the IBM Journal of Research and Development, pages 110 through 119; the article entitled "Introduction to Array Logic" by F. Fleisher and L. I. Maissel published in the March 1975 issue of the IBM Journal of Research and Development page 98 through 109; the article entitled "Array Logic Macros" by J. W. Jones published in the March 1975 issue of the IBM Journal of Research and Development pages 120 through 125; U.S. patent application Ser. No. 534,944, entitled "Time Split Array Logic Element and Method of Operation", filed Dec. 20, 1974 by E. I. Muehldorf now U.S. Pat. No. 3,987,286, granted Oct. 19, 1976 and of common assignee herewith; U.S. Pat. application Ser. No. 480,794, filed June 19, 1974 entitled "Improved Read/Write Array" by R. I. Spadavecchia and J. R. Struk and of common assignee herewith.

It is a necessary requirement of the generalized structure shown in FIG. 1 that two or more independent clock signal trains be employed to control the clocking of signals in the same unit. As already stated, a latch or latch set controlled by one clock signal train cannot be coupled back through combination logic to other latches that are controlled by the same clock signal train. Thus, latch set 18 may not be clocked by clock train C1 or clock train C2. However, latch set 17 can be coupled into latch set 13, 14, and 15 which respond to different clock trains.

The manner in which each latch set in FIG. 1 is controlled by exactly one of these clock signal trains is for each controlling clock signal Ci to be associated with a latch Lij receiving two other signals: an excitation signal Eij and possibly a gating signal Gij. These three signals control the latch so that when both the gating signal and the clock signal are in an "up" state or binary one condition, the latch is set to the value of the excitation signal. When either the clock signal or the gating signal is a binary zero or in a "down" state, the latch cannot change state. It is also to be understood that the clocking may be accomplished by having the clock signal trains act directly on the respective latch sets without utilizing the sets of gating signals G1, G2, -, GN, H1, H2, - Hk and the intermediary AND gates.

Figure 2:
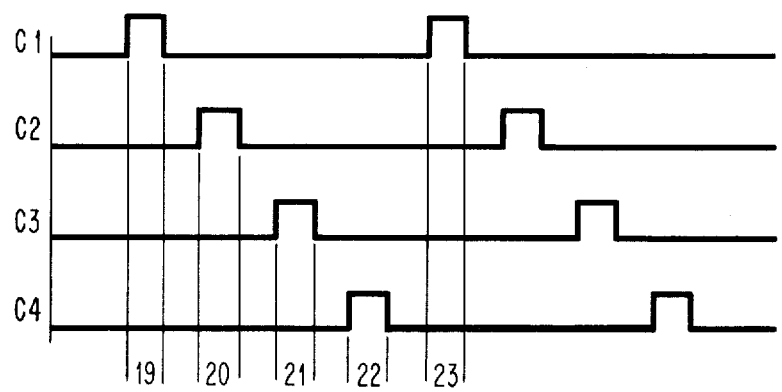
FIG. 2 is a timing diagram of the system clocking, in accordance with the invention, and employed with the Level Sensitive Embedded Array Logic System of FIG. 1.

The operation of the logical system is determined by the clock signal trains. With reference to FIG. 2, with the rise of C1 in time frame 19, C2, C3 and C4 are zero and the inputs to latch sets 13, 15 are stable. Clock signal C1 is then gated through to the latches of sets 13 and 15 if the corresponding set of gating signals G1, GN are "up", or binary one level. The latches of sets 13, and 15 are set to the value of their set of excitation signals S. Thus, some of the latches in latch set 13 or 15 may be changed during the time that C1 is in an "up" state. The duration of time from 19 need only be long enough for the latches to be set, i.e., change state. The signal changes in the latches immediately propagate through combinational networks 10, 11. Another clock signal C2 goes to an "up", or binary one, condition as shown in time frame 20. The excitation signal S must be stable. This action may result in some of the latches in latch set 14 changing state during this time (frame 20). The signal changes in latch set 14 immediately propagate through combinational networks 10 and 11.

It is to be noted from FIG. 2 that the clock pulses of C1, C2, C3 and C4 are not overlapping (i.e., displaced in time). The time displacement between clock pulse trains C1, C2, C3, and C4 need only be of sufficient time duration to permit pulses from the latches changing state to fully propagate.

If the write mode is established at the array inputs write control (C1C, FIG. 3), then the data at the array data inputs D1 in FIG. 3 will be stored in the array at the address presented at A1. If the read mode is established at the array inputs then the data stored at address A1 presented to the array, will be presented to the outputs of the array B1 (O1, FIG. 3). This action will result in some of the array outputs B1 in FIG. 1 to be changed. The signal changes in B1 will immediately propagate through combinational network 11.

When clock signal C3 is changed from a "down" condition to an up condition, in the presence, in the presence of gating signals H1 and Hk, the latches in set 16, 18 store the excitation signals from network 11. In a similar manner, when clock signal C4 is changed to an up condition, in the presence of gating signal H2, latch set 17 stores the excitation signals from network 11. Thus, for proper and correct operation of the logic system, it is necessary that the clock signals have a duration long enough to set the latches and a time interval between signals of successive clock trains that is sufficient to allow all latch changes to finish propagating through the combinational networks and all array changes to finish propagating through the combinational networks. Such operation meets the requirement for a level sensitive system and assures a minimum dependency on ac circuit parameters.

Information flows into the level sensitive embedded array logic through the set of input signals S. These input signals constitute the excitation for latch sets 13, 14, and 15. If the external input signals are asynchronous in that they change state at any time, then the manner of handling these signals within the logic system is accomplished by synchronizing them using latches. A latch receives as inputs one of the excitation signals as well as the particular clock signal. As the latch cannot change when the clock signal is at a "down" or binary zero condition, the output of the latch only changes during the period when the clock pulse is in an "up", or binary one condition. Even if the set of input signals S changes during the time when the clock signal is in the "up" condition, no operational problem occurs. If the latch almost changes, a spike output might appear from the latch during the time when the clock pulse is in the "up" condition. However, if the control lines to the array C1C are conditioned this might cause an inadvertent write mode. Namely, a write control line could be driven by a clock signal between C2 and C3, time 20 and 21, such that the array is only written when the write control is "up" or binary one condition. The write control (FIG. 1) will be described more fully hereinafter. Thus, this method of operation does not create any problems since the outputs of latch sets 13, 14, 15 are only employed during another clock time.

It is apparent from FIGS. 1 and 2 that the proper operation of the logic system is dependent only on the propagation time or delay through the combinational networks 10, 11 and the propagation time or delay through the array 12. This delay time must be less than the corresponding time lapse between successive clock signals. If it is not, then the sets of latches cannot be set. This final timing dependency is eliminated by providing the capability of system reentry at a slower clock speed. The use of the longer clock pulses with more lapsed time between the clock signals results in successful reentry, even if the error was caused by a timing problem in the system. This approach provides improved system reliability, reduces no trouble found service calls in the field, and reduces the exposure of incomplete ac testing of highly dense logic and array chips.

A logic system having a single-sided delay dependency has the advantage of permitting the system to be modeled in slower speed function unit logic, that is readily changeable during developmental stages of the technology of implementation. The transition from unit logic to large scale integrated logic is then made with the only exposure being the maximum speed at which the chip successfully operates. If the circuit delays were different in the highly integrated version than anticipated, it would solely mean that the system would have to run at slower speeds. It thus, provides the capability for marginal testing for timing. For example, a worst case logic pattern is circulated in the system while the clock speed is slowly increased. Once the failing clock speed is established, either the clock is set for reliable operation or the failing unit is replaced with one that operates reliably at the rate of speed.

It has been emphasized that one of the significant objectives in such a generalized logic system as shown in FIG. 1, is to obtain a system that is insensitive to ac characteristics. To accomplish this, the storage elements within such a system are level sensitive devices that do not have any hazards or race conditions. Circuits that meet this requirement are generally classified as clocked dc latches. A clocked dc latch contains two types of inputs: data inputs and clock inputs. When the clock inputs are all in the same state, for example, a binary zero state, the data inputs cannot change the state of the latch. However, when a clock input to a latch is in the other state, that is, a binary one state, the data inputs to the latch control the state of the latch in a dc manner.

Figure 4:
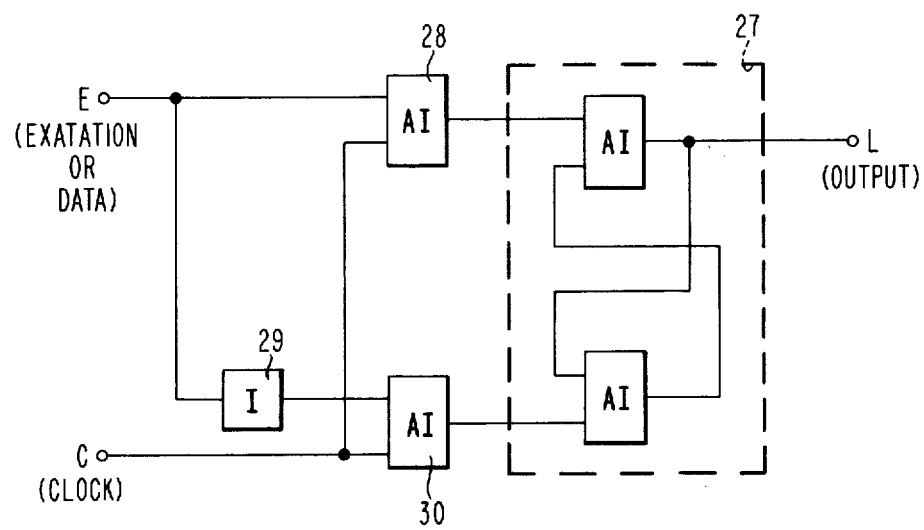
FIG. 4 is a block diagram of one form of clocked dc latch implemented in AND-INVERT gates which may be used in the Level Sensitive Embedded Array Logic System of FIG. 1.
Figure 5:
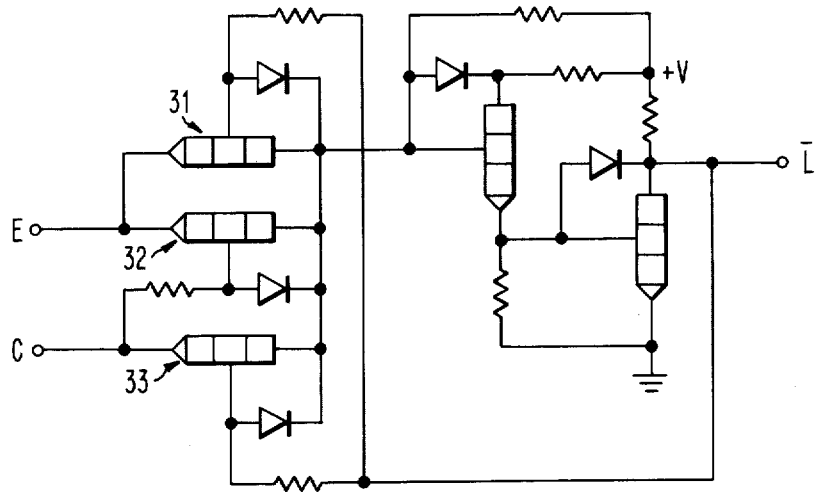
FIG. 5 is a circuit diagram of a latch performing the inverse of the same function as the latch shown in FIG. 4.

One such latch of the dc clocked type is the polarity hold latch implemented in FIG. 4 in AND Invert gates, and in FIG. 5 in semiconductor logic circuitry. In FIG. 4, the storage portion of the latch is enclosed by broken line 27. FIG. 4 employs AND Invert gates 28, 30 and inverter 29. The equivalent transistor circuitry in FIG. 5 includes the transistor inverters 31, 32, 33 arranged in combinational logic circuits with transistors 31 and 33 included in the feedback circuits for the storing elements.

The polarity hold latch has input signals E and C and a single output indicated as an L. In operation, when clock signals C is at a binary zero level, the latch cannot change state. However, when C is at a binary one level, the internal state of the latch is set to the value of the excitation input E.

Figure 6:
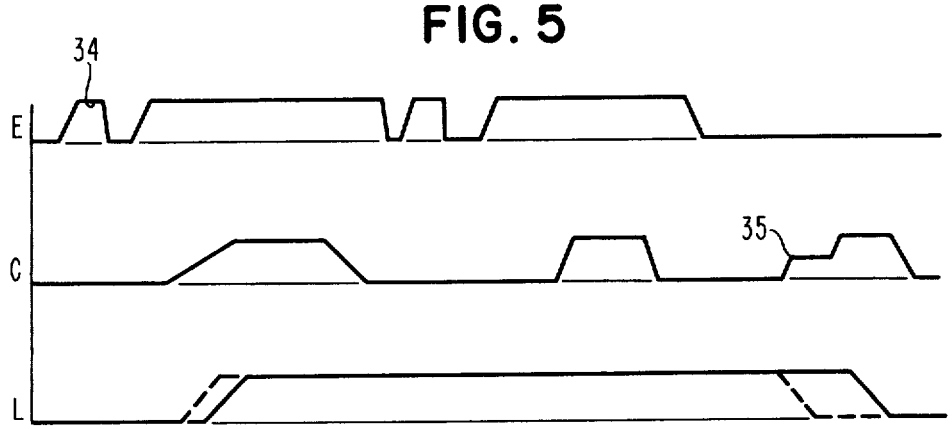
FIG. 6 is a timing diagram for the latch of FIG. 4.

With reference to FIG. 6 under normal operating conditions clock signal C is at binary zero level (for purposes of description, the lower of the two voltage levels) during the time that the excitation signal E may change. Maintaining signal C in the binary zero conditions prevents the change in excitation signal E from immediately altering the internal state of the latch. The clock signal normally occurs (binary one level) after the excitation signal has become stable at either a binary one or a binary zero. The latch is set to the new value of the excitation signal at the time the clock signal occurs. The correct changing of the latch is, therefore, not dependent on the rise time or the fall time of the clock signal, but is only dependent on the clock signal being a binary one for a period equal to or greater than the time required for the signal to propagate through the latch and stabilize.

The signal pattern of FIG. 6 indicates how spurious changes in the excitation signal do not cause the latch to change state incorrectly. Thus, spurious changes at 34 in excitation signal E does not cause a change in the state of the latch as indicated by the output signal characteristics L. In addition, poorly shaped clock signals such as 35 do not result in an incorrect change in the latch. These characteristics of the polarity hold latch are employed in the generalized structure for the logic system of FIG. 1.

Figure 7:
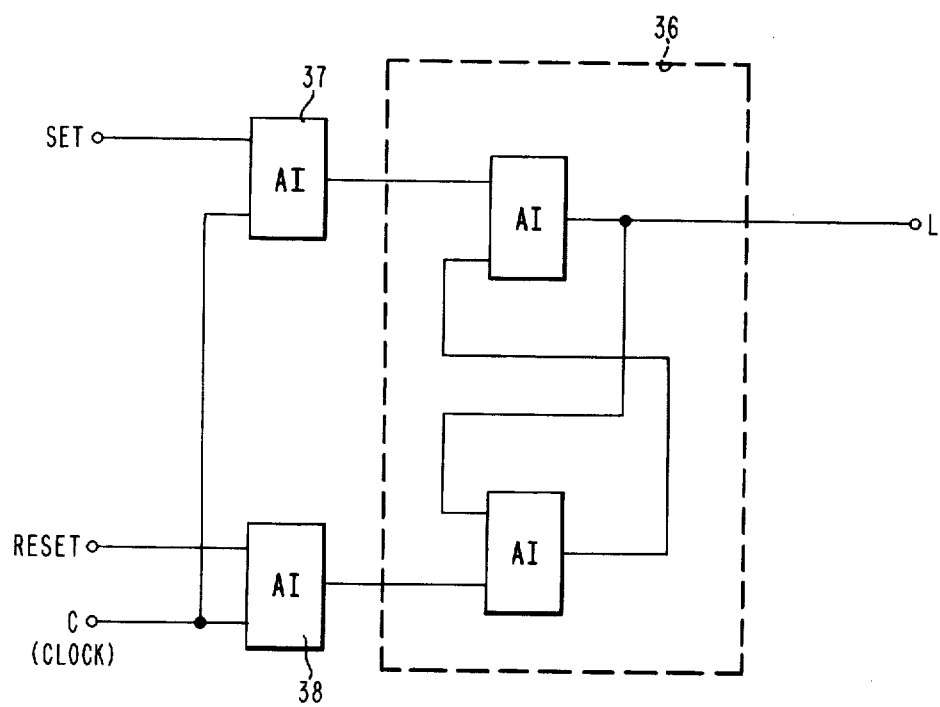
FIG. 7 is a block diagram of another clocked dc latch which may be employed in the Level Sensitive Embedded Array Logic system of FIG. 1.

Referring now to FIG. 7, there is shown another latch circuit employable as a sequential circuit in a level sensitive logic system. This latch is a clocked set-reset latch in which the latching portion is indicated by enclosed broken line 36. It receives its inputs from the AND Invert logic circuits 37, 38 which are coupled, respectively, to set and reset inputs and to a clocking signal train at C. The output signal indicative of the latch state is provided at L.

It is also a feature of the generalized logic system of this invention to provide the ability to monitor dynamically the state of all internal storage elements. This ability eliminates the need for special test points, it simplifies all phases of manual debugging, and provides a standard interface for operator and maintenance consoles. To achieve this ability, there is provided with each latch in each latch set of the system, circuitry to allow the latch to operate as one position of a shift register with shift controls independent of the system clocks, and an input/output capacity independent of the system input/output. This circuit configuration is referred to as a shift register latch. All of these shift register latches within a given chip, module, etc. are interconnected into one or more shift registers. Each of the shift registers has an input and an output and shift controls available at the terminals of the package.

By converting the clocked dc latches into shift register latches, the advantages of shift register latches are present. These include the general capability of stopping the system clock, and shifting out the status of all latches and/or shifting in new or original values into each latch. This capability is referred to as scan-in/scan-out or log-in/log-out. In the testing of the functional unit, dc testing is reduced from sequential testing with embedded arrays to combinational testing with embedded arrays which is substantially easier and more effective. For ac testing, the well-defined ac dependencies, the scan-in/scan-out capability provides the basis for efficient, economical and effective ac tests. Scan-in/scan-out provides the necessary capability for accurately diagnosing both design errors and hardware failures for system bring up, final system tests and field diagnostics. The shift registers are also usable for system functions such as a console interface, system reset, and check pointing.

Figure 8:
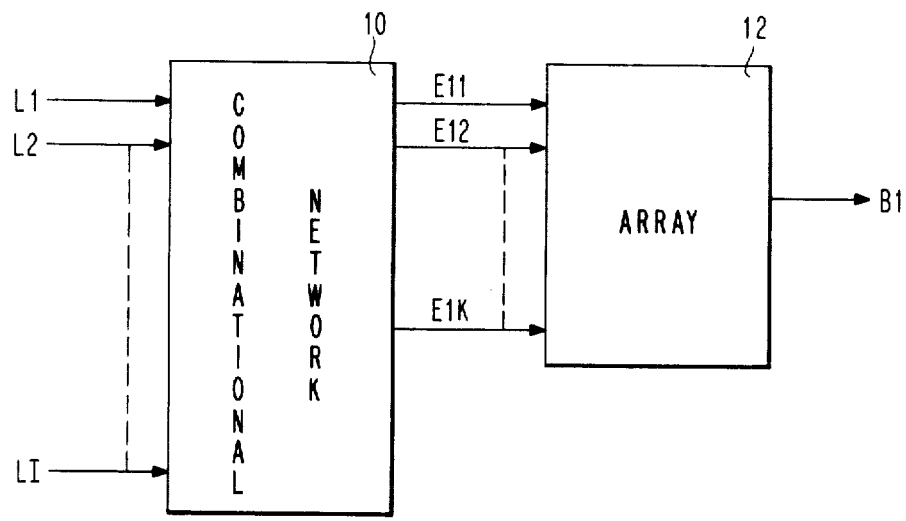
FIG. 8 shows an expanded view of a portion of Level Sensitive Embedded Array Logic System of FIG. 1. In particular, an expanded view of the combinational network 10 with its set of latch inputs and its set of Array inputs.

There are attributes of the combinational network 10, 11 in FIG. 1 which are needed. Combinational network 10 must have the property that for some combination of values in latch sets 13, 14, 15, each particular array input is controlled by a particular latch set such that there is a one to one correspondence between latch sets 13, 14 and 15 and array inputs E1. FIG. 8 gives an expanded view of the combinational network 10 with its latch set inputs L1, L2, - LI and its array inputs E11, E12, - , E1K. For every E11, $i = 1, 2, - K$, there must exist simultaneously, a unique Lj, $j = 1, 2, - I$, such that E11 equals Lj or its logical complement. With this attribute, the array can be loaded with any data in any address without having to do any backwards justification. This saves an enormous amount of time in pattern generation. The combinational network 11 in FIG. 1 must have the property that all array output patterns B1 are uniquely detectable at the latch sets 16, 17 and 18.

It should be understood that all the inputs to combinational logic network 10 in FIG. 1 need not emanate from latch sets. They may emanate from inputs from the package either chip, module, etc. Furthermore, it should be understood that both combinatorial networks 10, and 11 may drive outputs of either chip, module, etc.

Among the advantages of this invention, the most significant are those that accrue in the area of testing. Although methods of both dc and ac testing are hereinafter generally described, it is to be understood that they are not included within the subject matter of this invention but are included within application Ser. No. 701,041 filed June 30, 1976 entitled "Method of Propagation Delay Testing a Functional Logic System with Embedded Array" and application Ser. No. 701,054 filed June 30, 1976 entitled "Method of Level Sensitive Testing a Functional Logic System with Embedded Array." These applications were filed concurrently with this application in the name of Edward B. Eichelberger et al. All of these applications are assigned to the same assignee. However, the circuitry necessary to accomplish this testing does constitute a part of this invention.

Heretofore, the circuits on a semiconductor chip have been sufficiently simple that considerable ac and dc testing could be performed to assure proper device and circuit operation. Subsequent testing at the module or card levels then concentrated on proper dc operation. Such testing verified that the circuits were correctly interconnected and had not been adversely affected by any of the steps in the fabrication processes. However, with the advent of large scale integration where a chip contains as many as 300 to 500 or more circuits and an embedded array, detailed ac testing is no longer possible and dc testing is extremely difficult due to the complexity of the functional unit under test and the significant change in the circuit to pin ratios on the chip.

As is well known in the art, the problem of automatically generating test patterns for combinatorial logic networks is relatively simpler than the generation of test patterns for complicated sequential logic circuits. The problem of automatically generating test patterns for arrays embedded into combinational logic networks is somewhat more involved than pure combinational logic, however, it is still significantly simpler than generation of test patterns for complicated sequential logic circuits with embedded arrays. Accordingly, it is necessary to render the sequential logic circuits such as the internal storage circuits of the generalized logic system to a form which permits the same type of test pattern generation to be employed as that used for combinational logic network with an embedded array. This is accomplished by including additional circuitry for selectively converting the clocked dc latches into shift register latches.

Referring to FIG. 9, a logic system with two clock signals, two sets of register latches, two combinational networks and an embedded array is depicted. The combinational networks 41, 42 are of the same type and nature as those described in connection with FIG. 1. They respond to signals from latch sets and the array. Combinational network 41 has the property that a one to one correspondence can be established from array inputs E2 to the network inputs E1. Furthermore, all array output patterns at E4 are uniquely detectable at E5. Latch sets 44, 45 differ from those in FIG. 1 in that they are connected as shift register latches. Such a shift register latch is shown in symbolic form in FIG. 10 as including two distinct latching or storing circuits 46, 47. Latch 46 is the same as the latch circuits employed in the latch sets of FIG. 1 and as shown in one form in FIG. 4. Each such latch has an excitation input E, a clock signal train input C, and an output indicated as L.

Latch 47 is the additional circuitry so as to render the structure as a shift register latch. It includes separate input U, a separate output V, and shift controls A and B. The implementation of the shift register latch in AND Invert gates is shown in FIG. 11.

Enclosed within the correspondingly labelled broken line is latch 46 which is a straight forward logical adaptation of the latch of FIG. 4. The additional input U is provided through AND Invert logic including gates 48, 49 and inverting circuit 50. This circuitry also accepts the first shift control input A. From these gates 48, 49 coupling is made to the latch circuit 46. From the outputs of latch 46, there is provided a second latching circuit including the latch configuration 51. The AND Invert gates 52, 53 accept the outputs from the latch configuration of circuit 46 as well as the second shift control input B.

Circuit 51 acts as a temporary storage circuit during the shifting in and shifting out operation of the arrangement. These shift register latches are employed to shift any desired pattern of ones and zeros into the polarity hold latches 46. These patterns are then employed as inputs to the combinational networks which in turn form inputs to the array. The outputs from circuit 46 are then clocked into the latch circuit 51 and shifted out under control of shift signal B for inspection and measurement.

Figure 11:
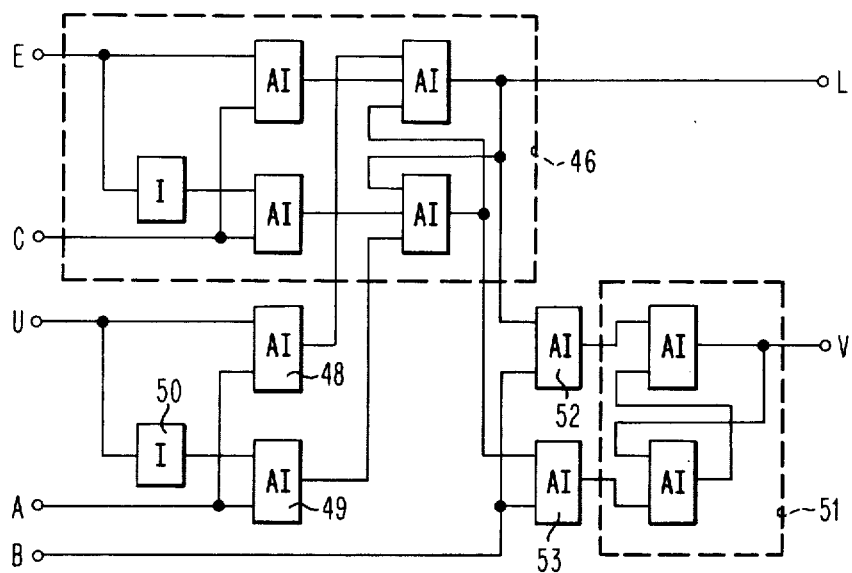
FIG. 11 is a block diagram of a clocked dc latch employed in the structure of the Level Sensitive Embedded Array Logic System (FIG. 9) having provision for Scan In/Scan Out.

Referring again to FIG. 9, each of the latch sets 44, 45 includes a plurality of the circuits shown in FIG. 11. The circuits are sequentially connected together such that the U input of FIG. 11 would be the input line 54 of FIG. 9. The A shift clock, or shift control input, is applied to the first circuit (for example, circuit 46) of all of the latches of the sets. Similarly, the B shift clock, or shift control input, is applied to the second circuit of each latch of the latch sets. The V output from circuit 51 of FIG. 11 would be coupled as the input to the next succeeding latch of the set, and so on, until the last such latch of the entire register. This output from the last such latch is the output line 55 in the arrangement of FIG. 9. The shift register latches are, therefore, interconnected with an input, an output, and two shift clocks into a shift register.

To illustrate how the combinational networks 41 and 42 and the array 43 of FIG. 9 may be tested, it is considered that a particular test pattern of binary ones and zeros is shifted into latch set 44 through, in and under the control of shift clocks A and B. The write control line 56 is held off from an input such that the array is not inadvertently written into during the shifting operation. After allowing time for signals to propagate through to E2 the array to be either written into or read out of and propagate through to E5, clock signal C2 is turned on for a duration sufficient to store the set of excitation signals E5 that are gated by the gates G2 into latch set 45. The pattern in latch set 45 is shifted out through line 55 and a comparison is effected with the pattern expected as a response. To accomplish the testing of the shift register configuration, a short sequence of binary ones and binary zeros is shifted through it. It is also possible to apply both shift clocks A and B simultaneously. The shift register output response on line 55 is observed as the shift register input on line 54 is shifted back and forth, between binary one and binary zero. This method of testing is applicable irrespective of the level of the package, such as the chip, module, card, board and system level.

Figure 10:
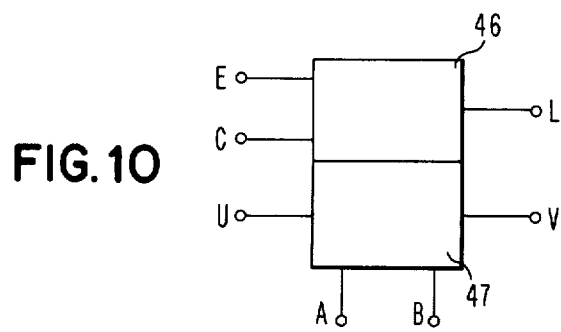
FIG. 10 is a symbolic representation of a latch configuration to be employed in the generalized structure of the Level Sensitive Embedded Array Logic System in accordance with the invention and as depicted in FIG. 9.
Figure 12:
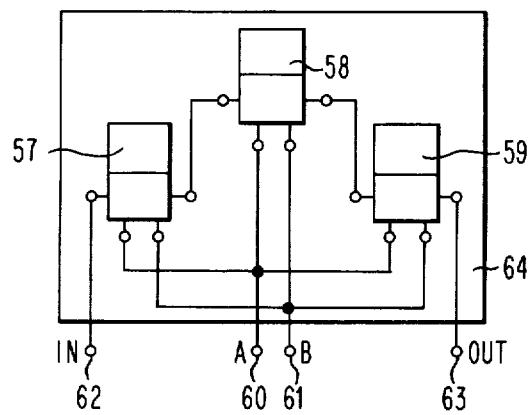
FIG. 12 is a symbolic illustration of the manner in which a plurality of the latches of FIG. 10 are interconnected on a single semiconductor chip device. Namely, the interconnection of a plurality of the latches of the type shown in FIG. 10, and as contained on a large scale integrated (LSI) circuit semiconductor chip containing a Level Sensitive Embedded Array Logic system, in accordance with the invention, is depicted.

In FIG. 12, three latches of the type shown symbolically in FIG. 10 are indicated at 57, 58, 59 on chip 64. Each of the latches is coupled to shift controls A and B provided on lines 60, 61 respectively. The input pattern is provided to the first of these latches 57, through connection 62 and the individual latches are sequentially coupled together as described above in connection with FIGS. 9 and 11 so that the output is obtained on line 63.

Figure 13:
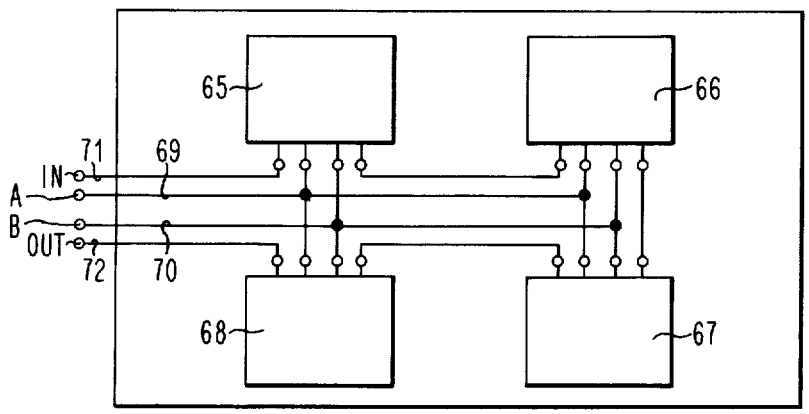
FIG. 13 is a symbolic illustration of the manner in which a plurality of such chip configurations as shown in FIG. 12 are interconnected, in accordance with the invention, on a module or electrical packaging structure.

In FIG. 13, four such chips, as depicted in FIG. 12, are coupled together. The four chips bear reference characters 65, 66, 67 and 68. The shift controls A and B are respectively provided through connections 69 and 70 to each of the chips 65 to 68. The input pattern is provided to the chip 65, of the sequentially connected chips 65 to 68 through line 71, and the output is taken via line 72 from the chip 68 of the sequentially connected chips 65 to 68.

Although the functional unit arrangement of the invention readily provides for dc testing of the logic and the embedded arrays, it also has the advantage of rendering the system relatively independent of transient or ac characteristics of the individual logic circuits and arrays in the system. There are two methods to do an ac test of the combinational logic and array. First, referring to FIG. 9, the values required in the latch set 44 are back traced, if possible, through the logic feeding S and G1 then the system clock C1 is brought to an "up" level, some of the latches in latch set 44 will change. These changes will propagate through the combinational networks 41 and 42 and result in writing the array or reading the array and eventually cause some changes at E5. Knowing what the worst case delay should be the C2 clock can be brought to an "up" level and returned to a "down" level. The pattern in latch set 45 is shifted out through line 55 and a comparison is effected with the pattern expected as a response.

The second method of ac testing is to use the shift register as the source of the ac test. The test pattern is shifted in with the A and B shift controls. However, the last shift clock which is required to cause a change at E1 will begin the propagation of the signals through combinational network 41 and 42, and the array 43. Knowing what the worst case delay should be the C2 clock can be brought to an "up" level and returned to a "down" level. The pattern in latch set 45 is then shifted out through line 55 and a comparison is effected with the pattern expected as a response.

It is thus evident that the only ac requirement of this arrangement is that the worst case delays through networks 41, 42, 43 must be less than some known values and there is no longer any need to control or test the individual rise times, fall times or minimum circuit delays. Only the maximum circuit delay need be controlled and measured. Only the total delays over paths from the input to the output of network 41, 42 and 43 need be measured.

One approach to accomplishing the testing for such delays is to evaluate automatically all delay paths and generate tests for them. This requires a very effective algorithm be developed in order to obtain the objective of complete testing.

As a second approach, some fundamental test patterns are cycled through the system so that they test the worst case delay path. The shift register is useful in inserting the initial bit pattern and in inspecting the final bit pattern after a number of complete cycles.

Both approaches permit marginal testing to be performed. Since the delay time is measured by the time between clock signals, the clock is run faster than normal during the test to insure a margin of safety driving actual system operation.

The most significant advantage accruing from the shift register latch configuration is the provision of the ability to make dynamic measurements of logic networks that are buried within a particular logic package. The field serviceman debugging the machine or servicing it to monitor the state of every latch in the system can accomplish it using the invention of this application. This is achieved on a single cycle basis by shifting all the data in the latches into a display device. It does not disturb the state of the system, if the data is also shifted back into the latches in the same order as it is shifted out. Thus, the status of all latches is examined after each clock signal.

By having the ability to examine the status of all latches, around the array, the need for special test points is eliminated, allowing the logic designer to package the logic as densely as possible without concern for providing additional input/output lines for the field service engineer. With the ability to examine every latch in a system around an array after each clock signal, any fault that occurs can be narrowed down to a particular combinational logic network and/or array whose inputs and outputs can be controlled.

With at most four additional inputs/outputs required to implement this generalized systems of logic, a standard interface is provided that allows greater flexibility to the designer and at operator or maintenance consoles. The consoles are changeable without in any way changing the logic system. These controls also enable diagnostic tests to be performed under the control of another processor or tester and for functions such as reset, initialization and error recording to be accomplished through the shift registers.

While this invention has been particularly described with reference to the preferred embodiments thereof, it will be understood by those skilled in the art that the foregoing and other changes in form and details may be made therein without departing from the spirit and scope of the invention.

What is claimed is:

1. A level sensitive embedded array logic system fabricated by large scale integration techniques on a semiconductor chip: said system comprising:
   means for generating a set of system input signals;
   means for generating a plurality of clock signal trains having a predetermined duration between the occurrence of signals in successive trains;
   a first group of latch circuit means connected to said means for generating said set of input signals and said means for generating said plurality of clock signals, said first group of latch circuit means receiving at least certain ones of said set of system input signals and selected ones of said clock signal trains;
   a second group of latch circuit means including system output means, said second group of latch circuit means being connected to said means for generating said plurality of clock signal trains and receiving at least certain other selected ones of said clock signal trains;

combinational logic circuit means including at least one read/write array and said combinational logic circuit means connecting said first group of latch circuit means to said second group of latch circuit means.

2. A level sensitive embedded array logic system as recited in claim 1, wherein said combinational logic circuit means further includes plural stages of logic and said combinational logic circuit means including at least one read/write array has an overall propagation time delay less than said predetermined duration between the occurrence of signals in successive trains.

3. A level sensitive embedded array logic system as recited in claim 2, wherein each latch circuit means includes at least one bistable dc latch having an excitation input, a clock input and an output, and wherein a plurality of non-overlapping and independent clock sources provide the plural trains, with the clock signals in each train having a duration sufficient to permit the bistable dc latch of the latch circuit means with which the particular train is associated to change state if so directed by its excitation input.

4. A level sensitive embedded array logic system as recited in claim 2 wherein each said latch circuit means includes at least one polarity hold latch.

5. A level sensitive embedded array logic system as recited in claim 2 wherein each said latch circuit means includes at least one clocked set-reset latch.

6. A level sensitive embedded array logic system as recited in claim 2, wherein each of said latch circuit means includes first and second bistable storage circuits connected with the output of the first storage circuit as an input to the second storage circuit, means for coupling an input signal to said first circuit independently of said set of system input signals and for coupling an output signal from said second circuit, and means coupled to the first and second circuits of each of said latch circuit means, whereby each of said latch circuit means is a shift register latch.

7. A level sensitive embedded array logic system as recited in claim 6 wherein all of the shift register latches are coupled together sequentially into at least one shift register with the first circuit of the first latch circuit means in the sequence accepting the input and the second circuit in the latch circuit means in the sequence providing the output and with the second circuit of each other latch circuit means connected to the first circuit of the next following latch circuit means in said sequence.

8. A functional logic unit, said functional logic unit comprising:
first means for providing a set of data input signals;
first latch circuit means receiving said set of data input signals and under control of at least one periodic clock signal train providing a set of output signals;
a combinational logic network circuit having a set of input terminals for receiving said set of output signals from said first latch circuit means and providing a set of output signals;
combinational logic network circuit means including a read/write storage array having a storage capacity of M × N binary bits and receiving said set of output signals from said combinational logic network circuit and providing a functional logic unit output set of signals;
second latch circuit means receiving said functional logic unit output set of signals and under control of at least a second periodic clock signal train, where said clock signals of said first and second clock trains are nonoverlapping, providing a further set of signals;
and additional circuit means selectively interconnecting and feeding back at least a selected one of said further set of signals to said first latch circuit means.

9. A functional logic unit, said unit comprising:
a first plurality of latch circuit means, each said latch circuit means of said first plurality of latch circuit means receiving at least one data input and providing at least one data output, under control of at least one clock signal train input;
a second plurality of latch circuit means, each said latch circuit means of said second plurality of latch circuit means receiving at least one data input and providing at least one data output, under control of at least one clock signal train input:
a first combinational logic network having a plurality of inputs respectively connected to receive said data outputs of said first plurality of latch circuit means and providing first and second sets of outputs;
a read/write memory having the capacity to store an integer number of binary bits, said read/write memory receiving said first set of outputs from said first combinational logic network and providing a multi-bit binary output;
a second combinational logic network having a plurality of inputs respectively connected to receive said multi-bit binary output of said read/write memory and said second set of outputs of said first combinational logic network and providing a functional logic unit output to said data inputs of said second plurality of latch circuit means:
and connection means connecting at least certain ones of said data outputs of said second plurality of latch circuit means to predetermined ones of said data inputs of said first plurality of latch circuit means.

10. A functional logic unit, said functional logic unit comprising:
first means for providing a set of data input signals;
first latch circuit means receiving said set of data input signals and under control of at least one periodic clock signal train providing a set of output signals;
a combinational logic network circuit having a set of input terminals for receiving said set of output signals from said first latch circuit means and providing a set of output signals;
combinational logic network circuit means including a programmable logic array, said combinational logic network circuit means receiving said set of output signals from said combinational logic network circuit and providing a functional logic unit output set of signals;
second latch circuit means receiving said functional logic unit output set of signals and under control of at least a second periodic clock signal train, where said clock signals of said first and second clock trains are non-overlapping, providing a further set of signals;
and additional circuit means selectively interconnecting and feeding back at least a selected one of said further set of signals to said first latch circuit means.

11. A functional logic unit, said unit comprising:
a first plurality of latch circuit means, each said latch circuit means of said first plurality of latch circuit means receiving at least one data input and providing at least one data output, under control of at least one clock signal train input;

a second plurality of latch circuit means, each said latch circuit means of said second plurality of latch circuit means receiving at least one data input and providing at least one data output, under control of at least one clock signal train input;

a first combinational logic network having a plurality of inputs respectively connected to receive said data outputs of said first plurality of latch circuit means and providing first and second sets of outputs;

a programmable logic array receiving said first set of outputs from said first combinational logic network and providing a multi-bit binary output;

a second combinational logic network having a plurality of inputs respectively connected to receive said multi-bit binary output of said programmable logic array and said second set of outputs of said first combinational logic network and providing a functional logic unit output to said data inputs of said second plurality of latch circuit means;

and connection means connecting at least certain ones of said data outputs of said second plurality of latch circuit means to predetermined ones of said data inputs of said first plurality of latch circuit means.

12. A level sensitive embedded array logic system fabricated by large scale integration techniques, said system comprising:

a set of input terminals for receiving a set of system input signals;

clock signal train means receiving a periodic input and generating a plurality of clock signal trains having a predetermined duration between the occurrence of signals in successive trains;

a first group of latch circuit means connected to at least certain ones of said set of input terminal means and said clock signal train means, said first group of latch circuit means receiving at least certain ones of said set of system input signals and at least a selected one of said clock signal trains;

a second group of latch circuit means including system output means, said second group of latch circuit means connected to said clock signal train means and receiving at least a selected other one of said clock signal trains;

combinational logic circuit means including array circuit means, said combinational logic circuit means connecting said first group of latch circuit means to said second group of latch circuit means.

13. A level sensitive logic system as recited in claim 12, wherein each of said latch circuit means of said first and second groups of latch circuit means is a shift register latch and wherein connection means interconnects said latch circuit means of said first and second groups of latch circuit means into at least one shift register.

14. A level sensitive logic system as recited in claim 13, wherein said shift register includes further means comprising a discrete shift register input, a discrete shift register output and discrete shift register control means, whereby data may be shifted into and out of said shift register independent of said combinational logic circuit means.

15. A functional logic unit, said unit comprising:

a first plurality of latch circuit means, at least certain of said latch circuit means of said first plurality of latch circuit means receiving at least one data input and providing at least one data output, under control of at least one clock signal train input;

a second plurality of latch circuit means, at least certain of said latch circuit means of said second plurality of latch circuit means receiving at least one data input and providing at least one data output, under control of at least one clock signal train input;

a first logic network having a plurality of inputs respectively connected to receive said data outputs of said first plurality of latch circuit means and provide first and second sets of outputs;

array circuit means for receiving said first set of outputs from said first logic network and providing a multi-bit binary output;

a second logic network having a plurality of inputs respectively connected to receive said multi-bit binary output of said array circuit means and said second set of outputs of said first logic network and provide a functional logic unit output to said data inputs of said second plurality of latch circuit means;

and connection means connecting at least certain ones of said data outputs of said second plurality of latch circuit means to predetermined ones of said data inputs of said first plurality of latch circuit means.

16. A functional logic unit as recited in claim 15 wherein additional means is provided for interconnecting said first and second plurality of latch circuit means into at least a first shift register having a shift register input, a shift register output and shift control means, whereby data may be shifted into and out of said shift register.

* * * * *